US012599031B2

(12) United States Patent
Chen et al.

(10) Patent No.: US 12,599,031 B2
(45) Date of Patent: Apr. 7, 2026

(54) SEMICONDUCTOR PACKAGE AND METHOD

(71) Applicant: Taiwan Semiconductor Manufacturing Co., Ltd., Hsinchu (TW)

(72) Inventors: Jian-You Chen, Hsinchu (TW); Kuan-Yu Huang, Taipei (TW); Li-Chung Kuo, Taipei City (TW); Chen-Hsuan Tsai, Taitung City (TW); Kung-Chen Yeh, Taichung City (TW); Hsien-Ju Tsou, Taipei (TW); Ying-Ching Shih, Hsinchu (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 645 days.

(21) Appl. No.: 17/822,476

(22) Filed: Aug. 26, 2022

(65) Prior Publication Data

US 2024/0071849 A1     Feb. 29, 2024

(51) Int. Cl.
| | |
|---|---|
| *H01L 23/00* | (2006.01) |
| *H01L 21/48* | (2006.01) |
| *H01L 21/56* | (2006.01) |
| *H01L 23/16* | (2006.01) |
| *H01L 23/31* | (2006.01) |
| *H01L 23/498* | (2006.01) |

(52) U.S. Cl.
CPC .......... *H01L 23/16* (2013.01); *H01L 21/4857* (2013.01); *H01L 21/56* (2013.01); *H01L 23/3157* (2013.01); *H01L 23/49822* (2013.01); *H01L 23/49833* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
None
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

FOREIGN PATENT DOCUMENTS

| | | |
|---|---|---|
| TW | 202230708 A | 8/2022 |

*Primary Examiner* — Nicholas J Tobergte
(74) *Attorney, Agent, or Firm* — Slater Matsil, LLP

(57) ABSTRACT

A semiconductor package including one or more dam structures and the method of forming are provided. A semiconductor package may include an interposer, a semiconductor die bonded to a first side of the interposer, an encapsulant on the first side of the interposer encircling the semiconductor die, a substrate bonded to the a second side of the interposer, an underfill between the interposer and the substrate, and one or more of dam structures on the substrate. The one or more dam structures may be disposed adjacent respective corners of the interposer and may be in direct contact with the underfill. The coefficient of thermal expansion of the one or more of dam structures may be smaller than the coefficient of thermal expansion of the underfill.

20 Claims, 19 Drawing Sheets

114

(56)                    References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 * | 8/2017 | Su et al. | |
| 2002/0060084 A1 * | 5/2002 | Hilton | H01L 24/32 |
| | | | 257/E21.503 |
| 2004/0212069 A1 * | 10/2004 | Chen | H01L 25/0657 |
| | | | 257/738 |
| 2005/0028361 A1 * | 2/2005 | Yin | H01L 24/29 |
| | | | 29/841 |
| 2006/0163749 A1 * | 7/2006 | Lee | H01L 21/563 |
| | | | 257/E21.503 |
| 2011/0037155 A1 * | 2/2011 | Pagaila | H01L 23/49827 |
| | | | 257/E23.08 |
| 2012/0187583 A1 | 7/2012 | Karpur et al. | |
| 2014/0138791 A1 * | 5/2014 | Chan | H01L 24/94 |
| | | | 257/528 |
| 2015/0325508 A1 * | 11/2015 | Chen | H01L 21/561 |
| | | | 438/126 |
| 2017/0084596 A1 * | 3/2017 | Scanlan | H01L 23/3675 |
| 2021/0391230 A1 | 12/2021 | Lu et al. | |
| 2022/0102313 A1 | 3/2022 | Jeng et al. | |

* cited by examiner

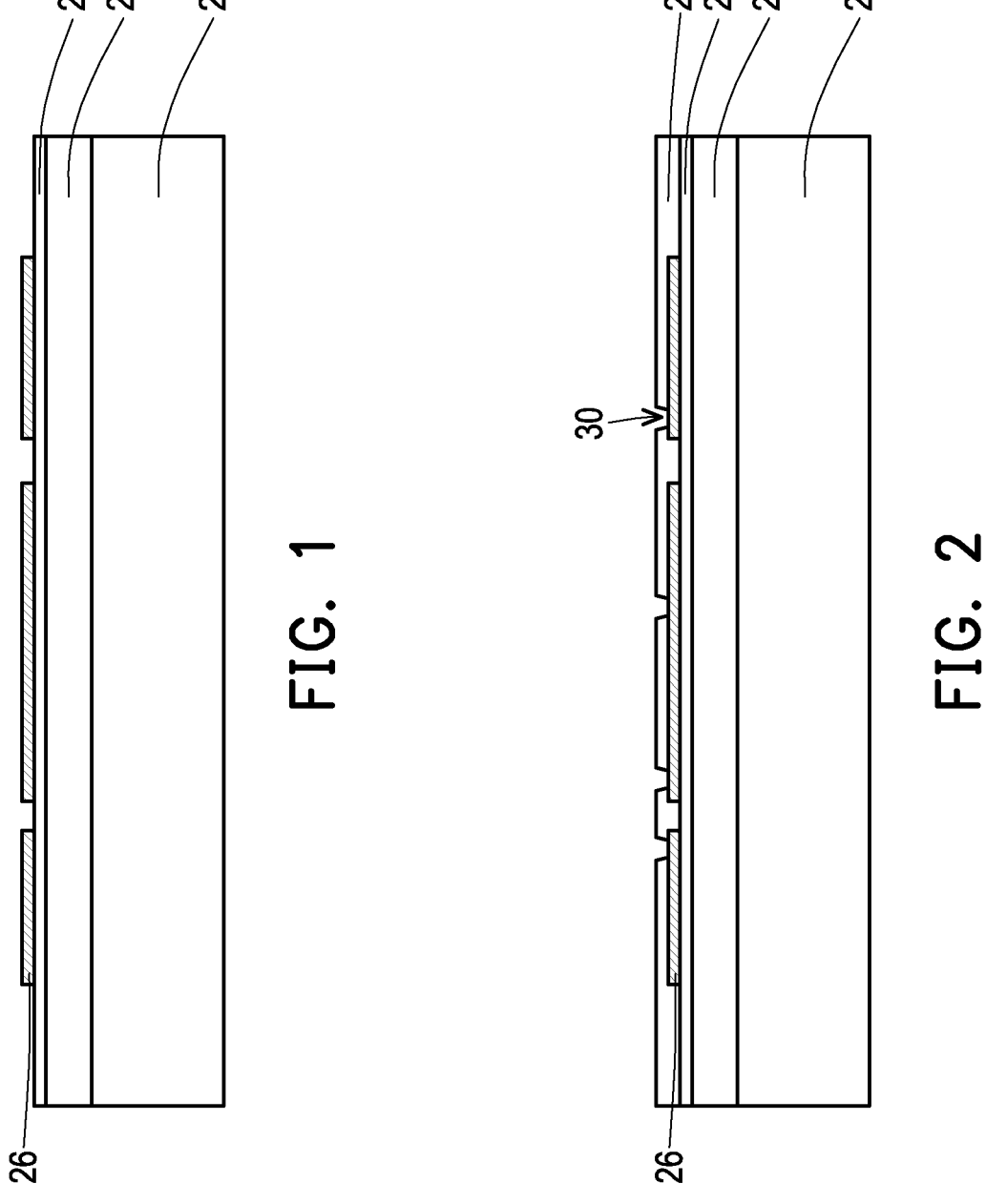

SEMICONDUCTOR PACKAGE AND METHOD

BACKGROUND

The formation of integrated circuits includes forming integrated circuit devices on semiconductor wafers, and then sawing the semiconductor wafers into device dies. The device dies may be bonded to package components such as interposers, package substrates, printed circuit boards, or the like. To protect the device dies and the bonding structures that bond a device die to a package component, an encapsulant such as a molding compound, an underfill, or the like, may be used to encapsulate the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-13, 14A, 14B, 14C, 14D, 14E, 15A, 15B, 16A, and 16B illustrate cross-sectional views and top views of intermediate stages in the formation of a package including dam structures in accordance with some embodiments.

DETAILED DESCRIPTION

Figure 3:
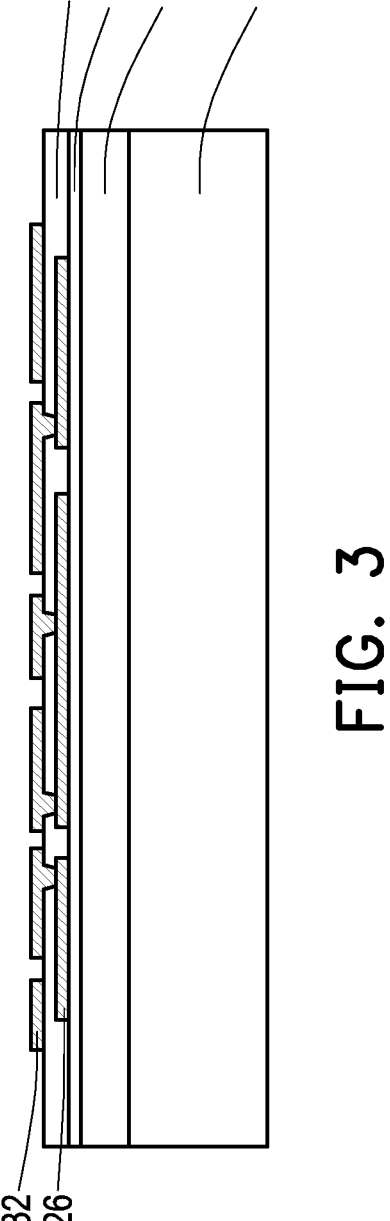

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package with dam structures and methods of forming the same are provided. In accordance with some embodiments, a package structure comprising a device die, an interposer, and an encapsulant, is bonded to a substrate. An underfill is formed between the package structure and the substrate. The dam structures are disposed in the underfill and adjacent the corners of the package structure. The coefficient of thermal expansion of the package structure matches more closely to that of the dam structures than to that of the underfill. The dam structures are disposed close to the package structure so that layers of the underfill between the dam structures and the package structure have small thicknesses. As a result, cracking or delamination of the underfill adjacent corners of the package structure may be prevented or reduced, which leads to better long-term reliability of the semiconductor package.

Embodiments discussed herein provide examples to enable making and using the subject matter of this disclosure, and it is understood that modifications can be made while remaining within contemplated scopes of different embodiments. Throughout the various views and illustrative embodiments, like reference numbers are used to designate like features. Although method embodiments may be discussed as being performed in a particular order, other method embodiments may be performed in any logical order.

Figure 4:
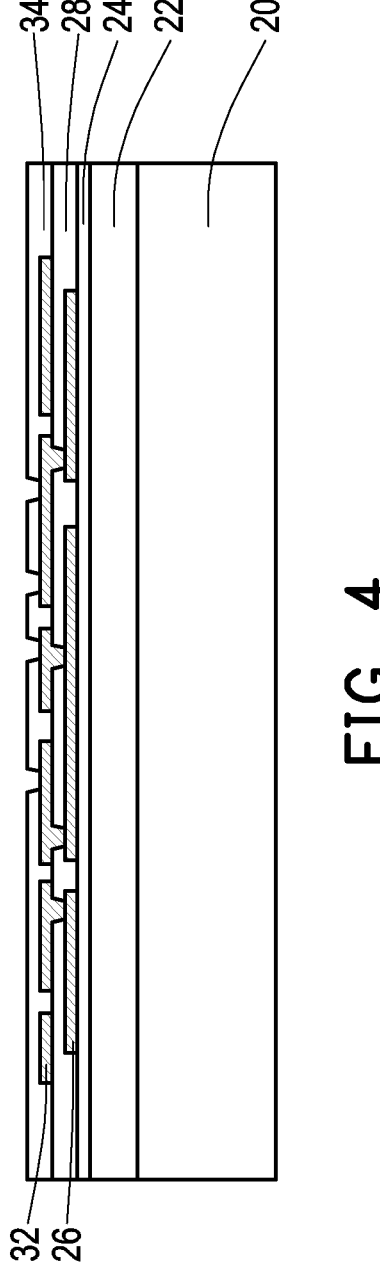
Figure 5:
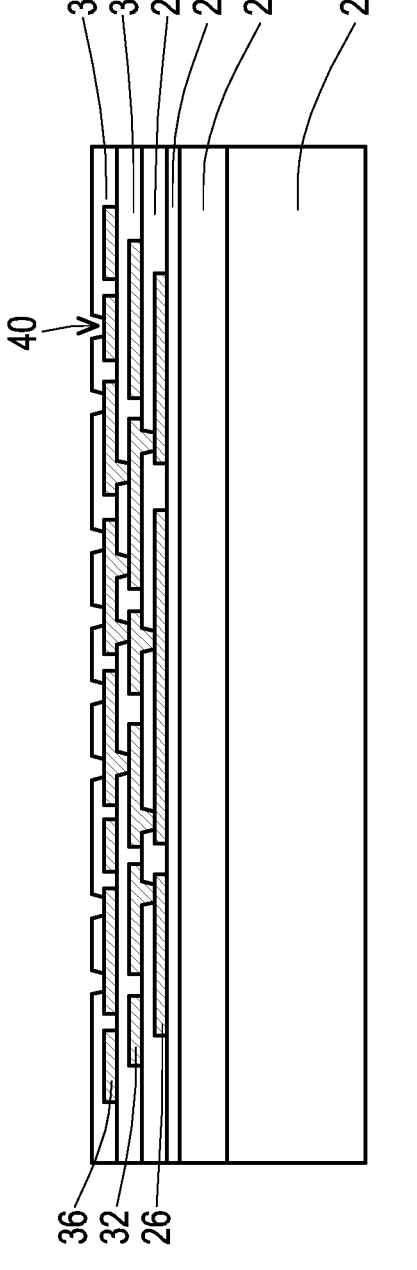
Figure 6:
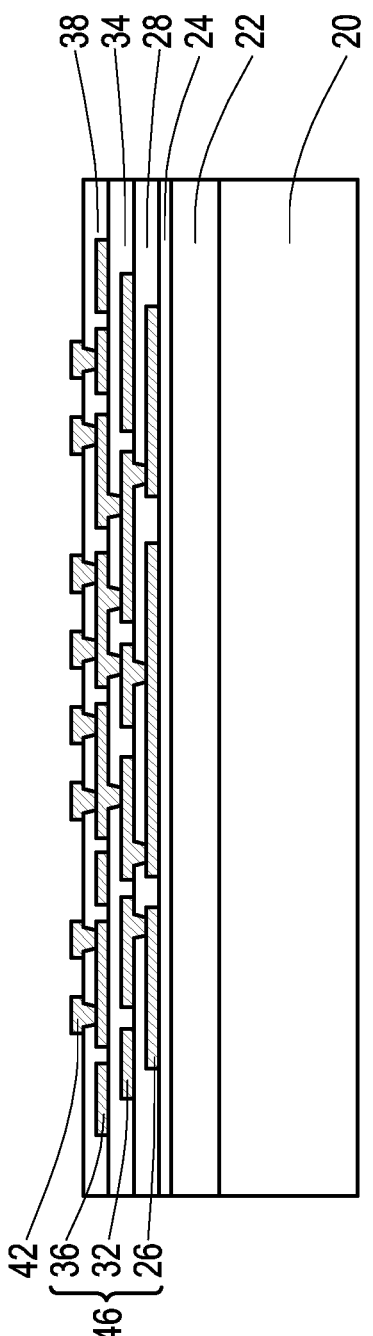
Figure 17:
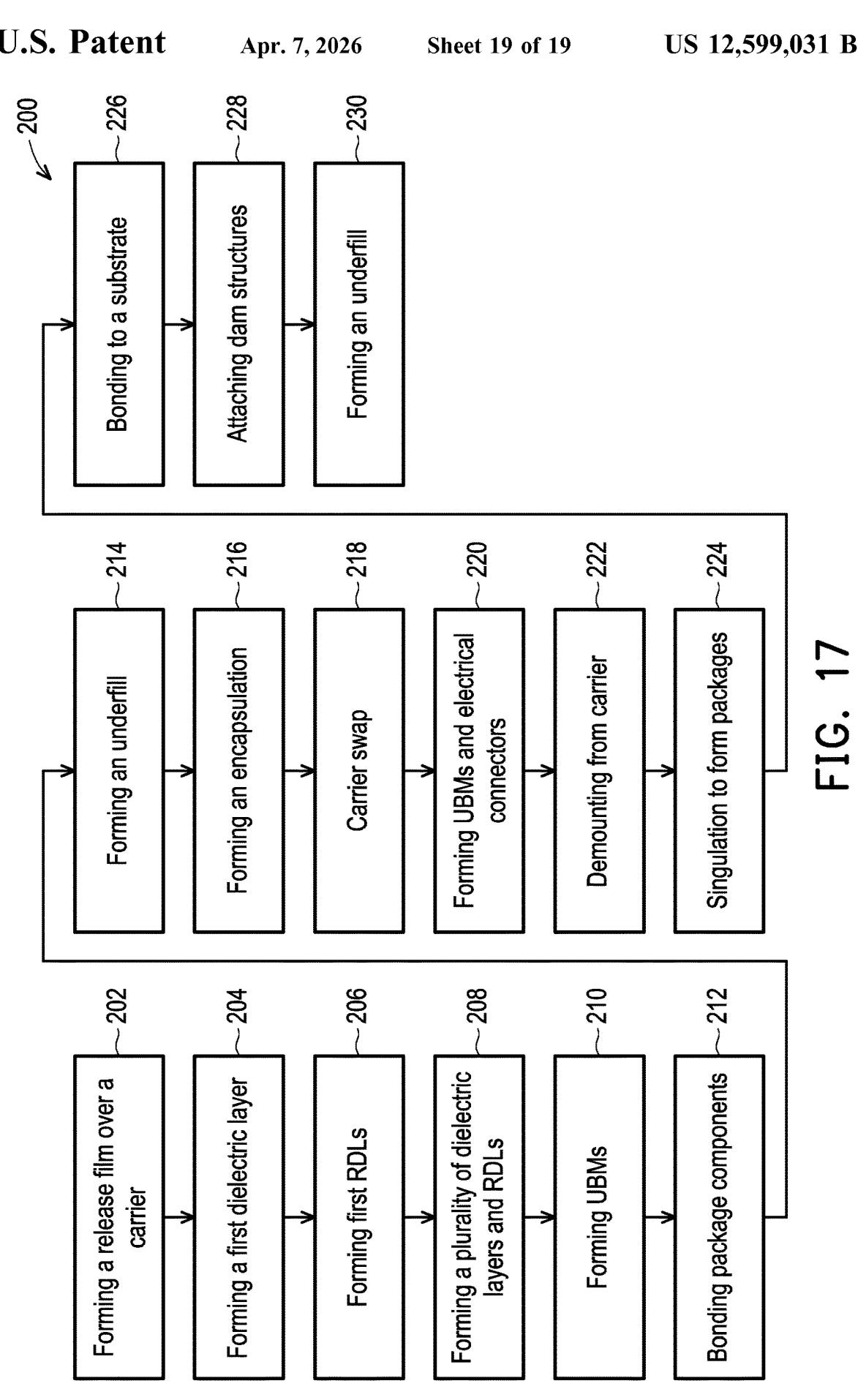
FIG. 17 illustrates a process flow for forming a package in accordance with some embodiments.

FIGS. 1 through 6 illustrate the cross-sectional views of the formation of an interposer 46 (e.g., a build-up interposer) as shown in FIG. 6. Referring first to FIG. 1, a release film 22 is formed on a carrier 20. The respective process is illustrated as process 202 in the process flow 200 as shown in FIG. 17. The carrier 20 may be a glass carrier, an organic carrier, or the like. The carrier 20 may have a round top-view shape, and may have a size of a silicon wafer. The release film 22 may be formed of a polymer-based material, such as a light-to-heat-conversion (LTHC) material, which may be removed along with the carrier 20 from the overlying structures that will be formed in subsequent steps. In some embodiments, the release film 22 comprises an epoxy-based thermal-release material. The release film 22 may be coated onto the carrier 20.

An insulating layer 24 is formed on the release film 22. The respective process is illustrated as process 204 in the process flow 200 as shown in FIG. 17. In some embodiments, the insulating layer 24 comprises an organic material (e.g., polybenzoxazole (PBO), polyimide, benzocyclobutene (BCB), or the like) or an inorganic dielectric material (e.g., silicon oxide, silicon nitride, silicon carbide, silicon oxynitride, silicon oxycarbide, silicon oxycarbonitride, Un-doped Silicate Glass (USG), or the like).

Redistribution lines (RDLs) 26 are formed over the insulating layer 24. The respective process is illustrated as process 206 in the process flow 200 as shown in FIG. 17. The formation of the RDLs 26 may include forming a seed layer (not shown) over the insulating layer 24, forming a patterned mask (not shown) such as a photoresist or one or more layers of dielectric material over the seed layer, and plating a conductive material on the exposed seed layer. The patterned mask and the portions of the seed layer covered by the patterned mask are removed. In embodiments in which the photoresist is used as the patterned mask, the patterned mask is removed by an acceptable ashing or stripping process, such as using an oxygen plasma or the like. In embodiments in which the one or more layers of dielectric material are used as the patterned mask, the patterned mask is removed by an acceptable stripping process, such as wet or dry etching. The remaining conductive material and the underlying seed layer may be collectively referred to as the RDLs 26 as shown in FIG. 1. The seed layer and the plated conductive material may be formed of the same material or different materials. The seed layer may be a single metal layer or a composite layer comprising a plurality of sub-layers formed of different metallic materials. In some embodiments, the seed layer may comprise a titanium layer and a copper layer over the titanium layer. The conductive material may be a metal or a metal alloy including aluminum, nickel, copper, titanium, tungsten, and/or alloys thereof. The seed layer may be formed using Physical Vapor Deposition (PVD) or the like. The plating process may be performed using Electro Chemical Plating (ECP), electroless plating, or the like.

FIGS. 2 through 5 illustrate the formation of one or more additional insulating layers and RDLs. The respective process is illustrated as process 208 in the process flow 200 as shown in FIG. 17. Referring to FIG. 2, an insulating layer 28 is formed and patterned on the RDLs 26. The bottom surface of the insulating layer 28 is in contact with the top surfaces of the RDLs 26 and the insulating layer 24. The insulating layer 28 may comprise an organic or inorganic material, which may be selected from the same group of candidate materials for forming the insulating layer 24. The insulating layer 28 is patterned to form openings 30 in the insulating layer 28 to expose portions of the RDLs 26.

In FIG. 3, RDLs 32 are formed to connect to the RDLs 26. The RDLs 32 may include metal lines over the insulating layer 28. The RDLs 32 may also include metal vias extending into the openings 30 in the insulating layer 28 to connect to a conductive line of the RDLs 26. The RDLs 32 may be formed using the same or similar materials and processes as discussed above with reference to the RDLs 26. In FIG. 4, insulating layer 34 is formed and patterned on the RDLs 32 and the insulating layer 28. The insulating layer 34 may be formed and patterned using the same or similar materials and processes as discussed above with reference to the insulating layer 24.

FIG. 5 illustrates the formation of RDLs 36, which are electrically connected to respective conductive features of the RDLs 32. The RDLs 36 may be formed using the same or similar materials and processes as discussed above with reference to the RDLs 26. Insulating layer 38 is formed on the RDLs 36 and patterned to form openings 40, and some portions of the RDLs 36 are exposed through the openings 40 in the insulating layer 38. The insulating layer 38 may be formed and patterned using the same or similar materials and processes as discussed above with reference to the insulating layer 24. While three layers of the RDLs (26, 32, and 36) are illustrated in FIG. 5 as an example, the structure may have any number of the RDL layers.

FIG. 6 illustrates the formation of conductive pads, such as Under-Bump Metallurgies (UBMs) 42. The respective process is illustrated as process 210 in the process flow 200 as shown in FIG. 17. The locations of the openings 40 (shown in FIG. 5) in the insulating layer 38 may correspond to the locations in which UBMs 42 are to be formed. The UBMs 42 be formed using the same or similar materials and processes as discussed above with reference to the RDLs 26. The insulating layers 24, 28, 34, and 38 and the RDLs 26, 32, and 36 may be referred to as the interposer 46. In some embodiments the conductive pads may comprise conductive pillars.

FIGS. 1 through 6 illustrated an example in which the interposer 46 is a build-up interposer formed on a carrier substrate. Other interposers may be used. In some embodiments, the interposer 46 is a semiconductor interposer, which may include a semiconductor substrate, such as silicon substrate, through-silicon vias and redistribution lines formed on the semiconductor substrate.

Figure 7:
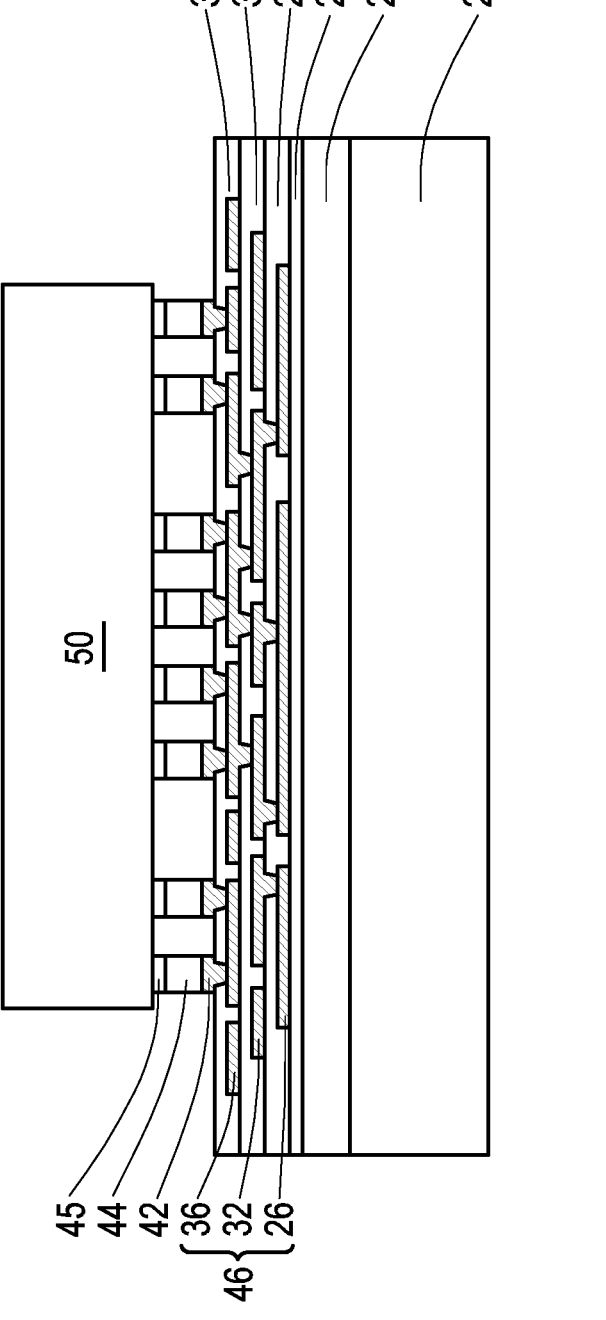

In FIG. 7, a package component 50 is bonded to the interposer 46. The respective process is illustrated as process 212 in the process flow 200 as shown in FIG. 17. The package component 50 may be a device die, a package with one or more device dies packaged therein, a System-on-Chip (SoC) die including a plurality of device dies packaged as a system, or the like. The device dies in the package component 50 may be or may comprise logic dies, memory dies, input-output dies, Integrated Passive Devices (IPDs), or the like, or combinations thereof. For example, the logic device dies in the package component 50 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in the package component 50 may include Static Random Access Memory (SRAM) dies, Dynamic Random Access Memory (DRAM) dies, or the like. The package component 50 may include external connectors 45.

In some embodiments, the package component 50 is bonded to the interposer 46 using electrical connectors 44. In some embodiments, the electrical connectors 44 may be solder balls. In some embodiments, the electrical connectors 44 may be non-solder metal pillars, or metal pillars and solder caps over the non-solder metal pillars, which may be formed through a plating process. Other types of bonding, such as metal-to-metal direct bonding, hybrid bonding (including both of dielectric-to-dielectric fusion bonding and metal-to-metal direct bonding), or the like may also be used. FIG. 7 shows a portion of the interposer 46 and the carrier 20 with one package component 50 attached to the interposer 46 for illustrative purposes. The interposer 46 may extend over a larger portion of the carrier 20, and other package components may be bonded to other portions of the interposer 46.

Figure 8:
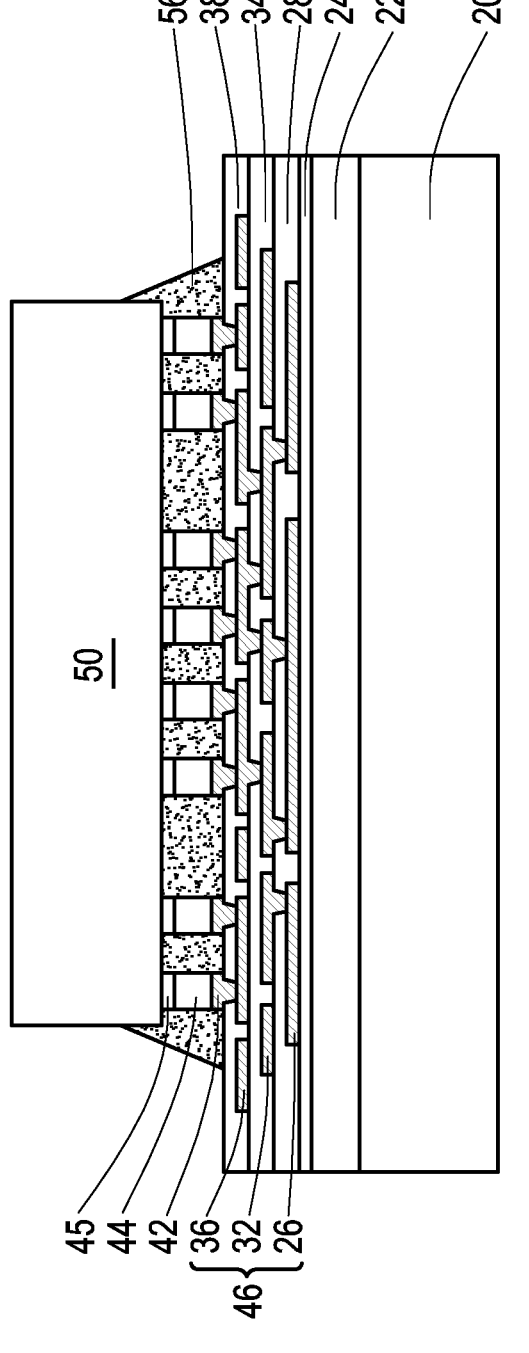

In FIG. 8, an underfill 56 is formed between the package component 50 and interposer 46 to reduce stress and protect the joints between the package component 50 and interposer 46, such as electrical connectors 44. The respective process is illustrated as process 214 in the process flow 200 as shown in FIG. 17. The underfill 56 may include a base material, such as an epoxy, and filler particles in the epoxy. The underfill 56 may be deposited by a capillary flow process after the package component 50 is bonded to the interposer 46 or may be formed by a suitable deposition method before the package component 50 is bonded to the interposer 46. For example, the underfill 56 may be dispensed from one side of the package component 50, and flow into the gaps between the package component 50 and the interposer 46 through capillary action. Underfill 56 may be subsequently cured.

Figure 9:
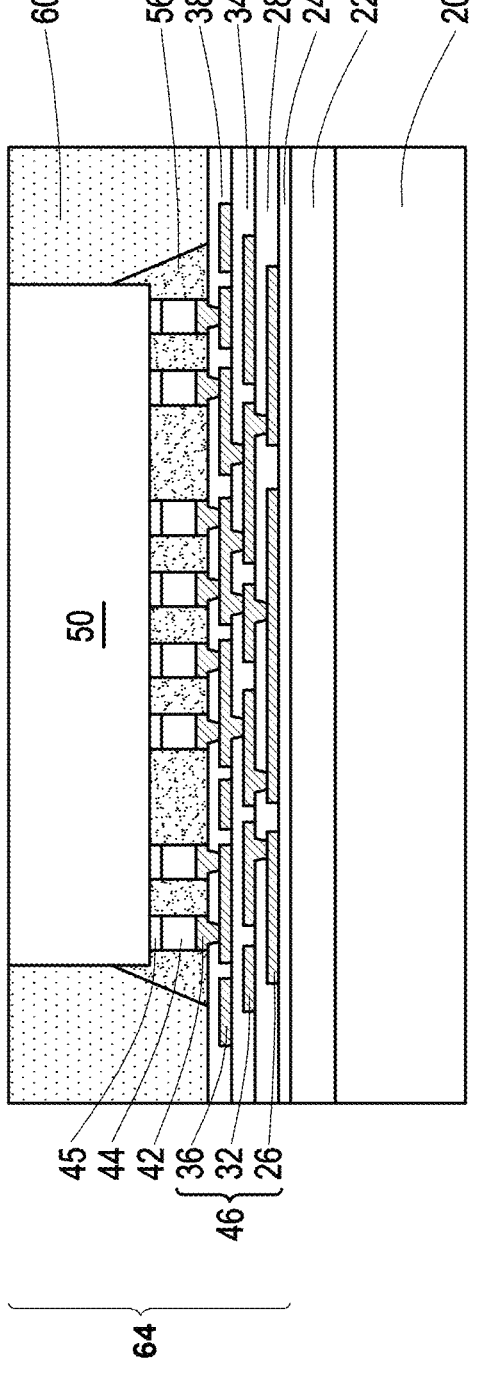

In FIG. 9, the package component 50 is encapsulated in encapsulant 60. The respective process is illustrated as process 216 in the process flow 200 as shown in FIG. 17. The encapsulant 60 covers the package component 50 and may fill the gaps, if any, between the neighboring package components 50 bonded to the interposer 46. The encapsulant 60 may comprise a molding compound, a molding underfill, an epoxy, a resin, or the like. In some embodiments, the encapsulant 60 may include a base material, which may be a polymer, a resin, an epoxy, or the like, and filler particles in the base material. The filler particles may include dielectric particles of silicon oxide, aluminum oxide, silica, or the like, and may have spherical shapes. Also, the spherical filler particles may have the same or different diameters. The encapsulant 60 may be applied by compression molding, transfer molding, or the like. The encapsulant 60 may be applied in liquid or semi-liquid form and subsequently cured.

A planarization process may be performed on the encapsulant 60 to expose top surface of the package component 50. The top surfaces of the package component 50 and the encapsulant 60 are substantially coplanar after the planarization process within process variations. The planarization process may be a chemical-mechanical polish (CMP), a grinding process, or the like. In some embodiments, the planarization may be omitted. In some embodiments, the encapsulant 60 may remain over the package component 50. The package component 50, the interposer 46, the underfill 56, and/or the encapsulant 60 may be collectively referred to as a wafer structure 64.

Figure 10:
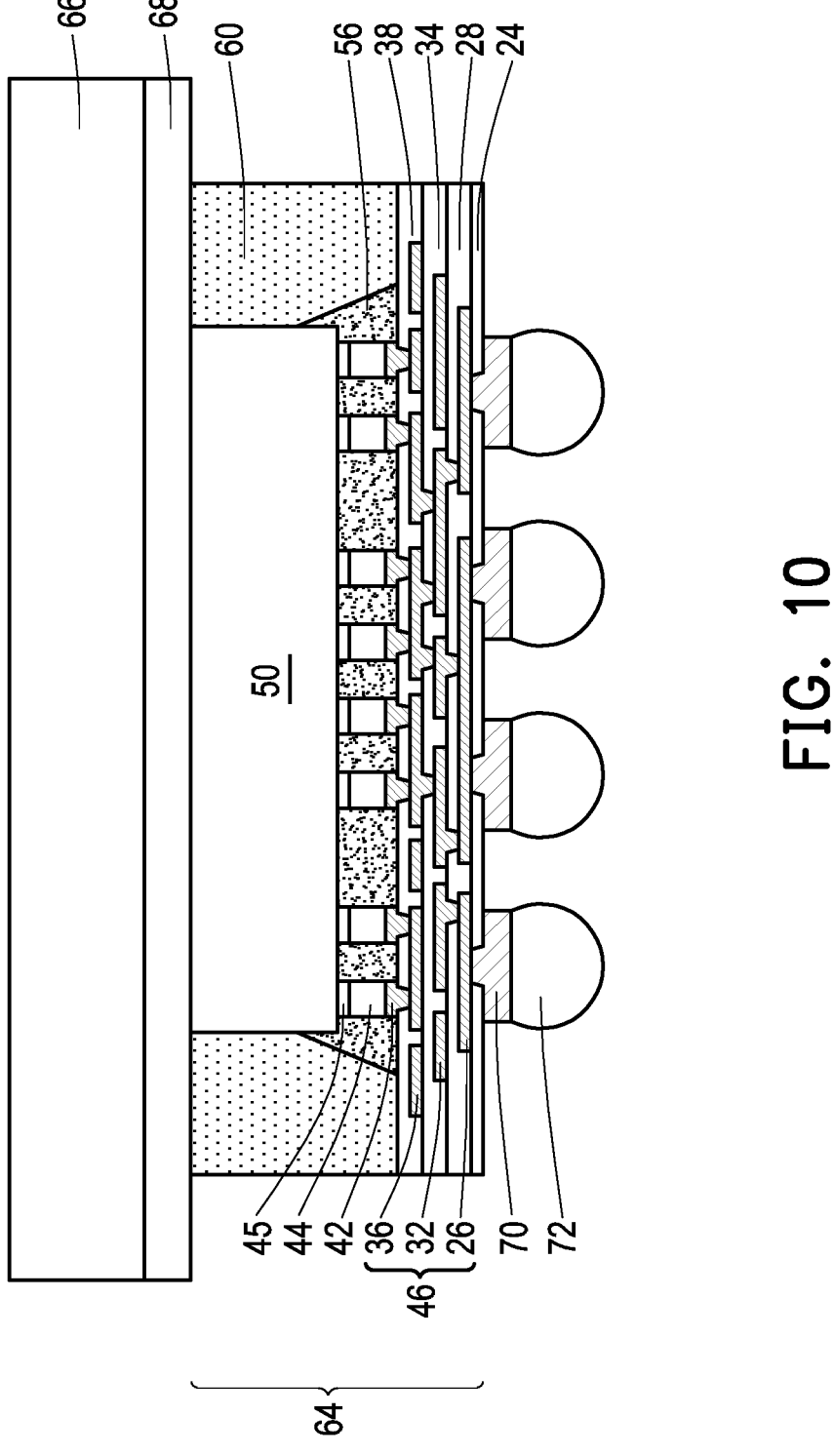

FIG. 10 illustrates a carrier swap and the formation of bottom-side electrical connectors on the bottom side of the interposer 46. The respective process is illustrated as process 218 in the process flow 200 as shown in FIG. 17. A carrier 66 is attached to an upper surface of encapsulant 60 and an upper surface of the package component 50 (if exposed) using release film 68, such as an LTHC material. Carrier 20, shown in FIG. 9, is detached from the wafer structure 64. In embodiments in which the release film 22 comprises an LTHC material, the detaching process may include projecting a light beam, such as a laser beam, on the release film 22 through the carrier 20, which may be transparent. As a result of the light exposure the release film 22 is decomposed, and the carrier 20 may be lifted off from the release film 22. The corresponding process is also referred to as the de-bonding.

As a result of the de-bonding process, the insulating layer 24 is revealed. The UBMs 70 and the electrical connectors 72 are formed on interposer 46 to provide an electrical connection to the package component 50. The respective process is illustrated as process 220 in the process flow 200 as shown in FIG. 17. The formation process may include patterning the insulating layer 24 to form openings exposing conductive pads formed in the RDLs 26. The UBMs 70 extend into the openings in the insulating layer 24 and are formed on the exposed conductive pads. The UBMs 70 may be formed using the same or similar materials and processes as discussed above with reference to the RDLs 26. Electrical connectors 72 are formed on UBMs 70. In some embodiments, the formation of the electrical connectors 72 may include placing solder balls on the exposed portions of UBMs 70, and reflowing the solder ball. In some embodiments, the electrical connectors 72 may be non-solder metal pillars, or metal pillars and solder caps over the non-solder metal pillars.

Figure 11:
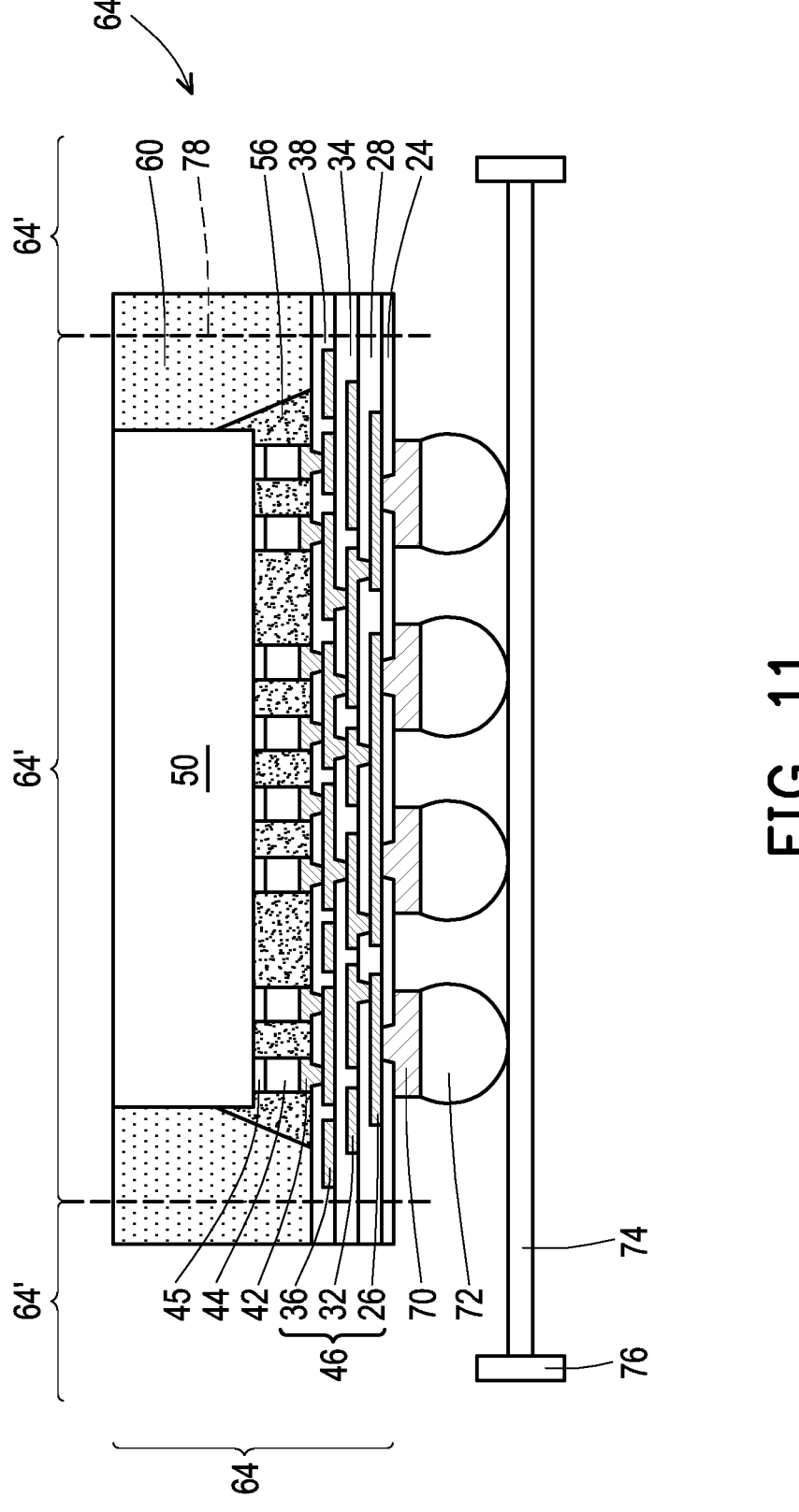

In FIG. 11, the wafer structure 64 is demounted from the carrier 66, shown in FIG. 10, for example, by projecting a laser beam on the release film 68, so that the release film 68 decomposes. The respective process is illustrated as process 222 in the process flow 200 as shown in FIG. 17. The wafer structure 64 is placed on a tape 74 supported by a frame 76. The wafer structure 64 is singulated along scribe lines 78, so that the wafer structure 64 is separated into discrete package structures 64'. The respective process is illustrated as process 224 in the process flow 200 as shown in FIG. 17. The package structure 64' may have a coefficient of thermal expansion $\alpha 1$ in a range from about $2 \times 10^{-6 \circ}$ C.$^{-1}$ to about $10 \times 10^{-6 \circ}$ C.$^{-1}$, such as about $5 \times 10^{-6 \circ}$ C.$^{-1}$. FIG. 11 illustrates one package component 50 in the package structure 64' as an example, more than one the package component 50 may be in package structure 64'.

Figure 12:
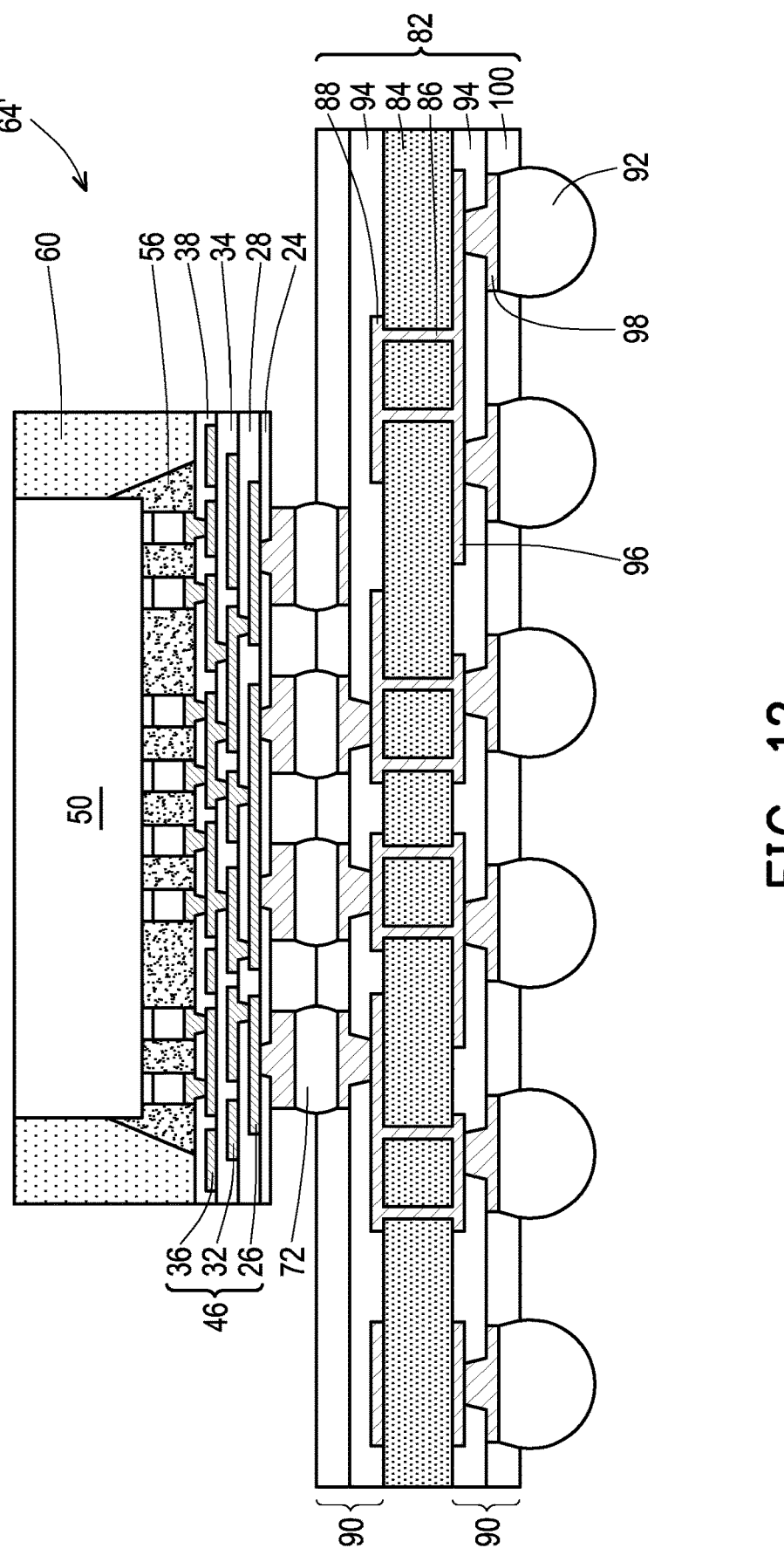

In FIG. 12, a package structure 64' is bonded with substrate 82. The bonding is via the electrical connectors 72, which may include solder regions. The respective process is illustrated as process 226 in the process flow 200 as shown in FIG. 17. The substrate 82 may be or may comprise an interposer, a package, a core substrate, a coreless substrate, a printed circuit board, or the like. FIG. 15, shows the substrate 82 as a core substrate, including core material 84, through vias 86, fill material 88, redistribution structures 90, and electrical connectors 92. Each redistribution structure 90 may comprise a dielectric layer 94, metallization patterns 96, UBMs 98, and solder resists 100. Each redistribution structure 90 may have more dielectric layers 94 and metallization patterns 96 than shown in FIG. 12.

Figure 13:
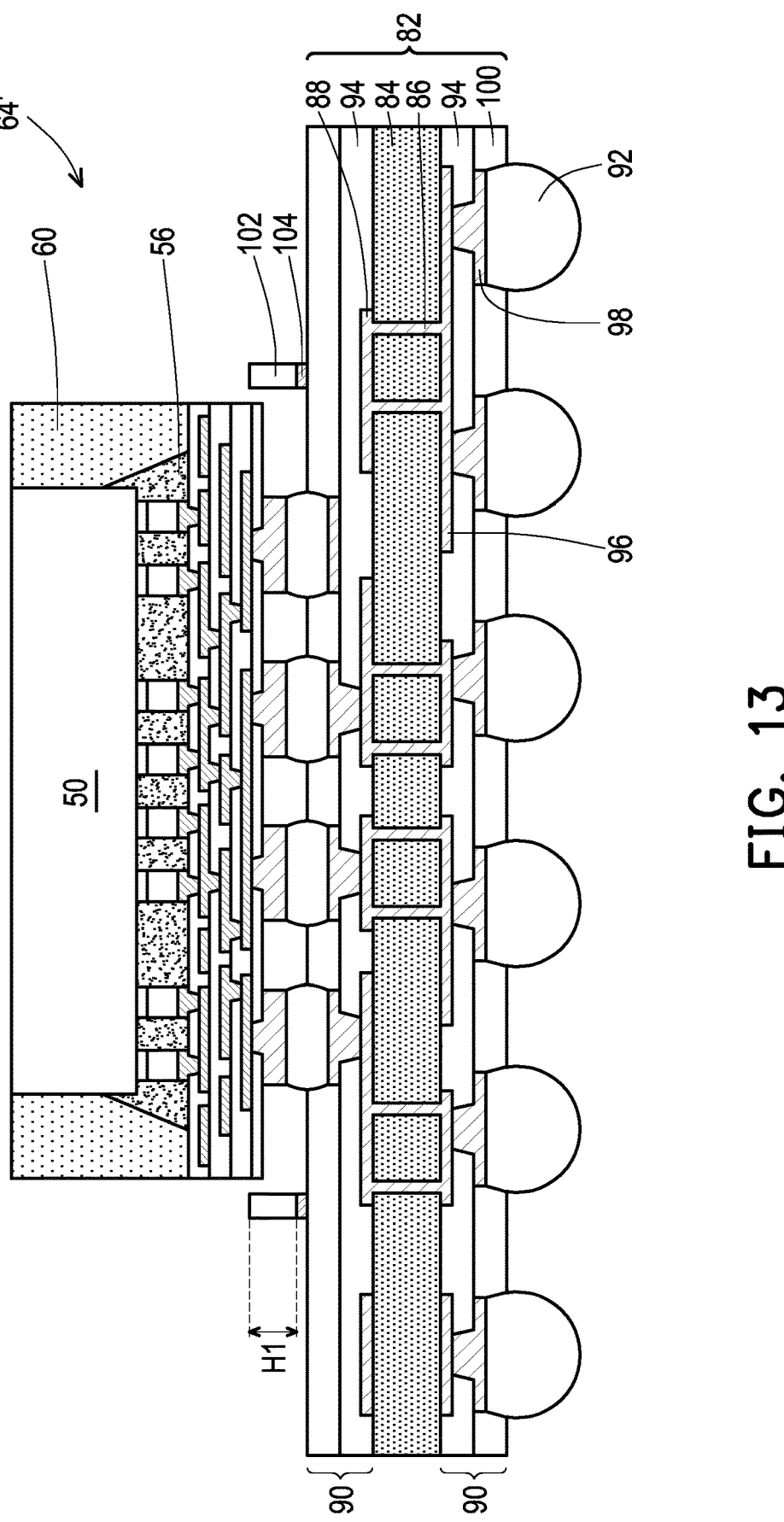

In FIG. 13, dam structures 102 are attached on the substrate 82 by an adhesive 104. The respective process is illustrated as process 228 in the process flow 200 as shown in FIG. 17. As discussed in greater detail below, the dam structures 102 may be disposed adjacent corners of the package structure 64', which may also be corners of the interposer 46. An underfill is subsequently formed that fills in gaps between the package structure 64' and substrate 82. By utilizing the dam structures 102, the cracking or delamination of the underfill adjacent corners of the package structure 64' may be prevented or reduced. The dam structures 102 may have a coefficient of thermal expansion $\alpha 2$ in a range from about $2 \times 10^{-6 \circ}$ C.$^{-1}$ to about $7 \times 10^{-6 \circ}$ C.$^{-1}$, such as about $3 \times 10^{-6 \circ}$ C.$^{-1}$. In some embodiments, the coefficient of thermal expansion $\alpha 2$ of the dam structures 102 may be equal to the coefficient of thermal expansion $\alpha 1$ of package structure 64'. In some embodiments, the dam structures 102 may comprise silicon, glass, metal alloys, ceramic, or the like. The dam structures 102 may have a height H1 in a range from about 0.3 mm to about 0.4 mm, which may lead to the dam structures 102 being completely embedded in the underfill, as discussed in greater detail below. The adhesive 104 may be a die attach film (DAF), an epoxy, glue, solder paste, thermal adhesive, or the like. FIGS. 12 through 13 illustrate the dam structures 102 attached to the substrate 82 after the package structure 64' is bonded to the substrate 82 as an example, the dam structures 102 may be attached to the substrate 82 before the package structure 64' are bonded to the substrate 82 in other embodiments.

Figure 14A:
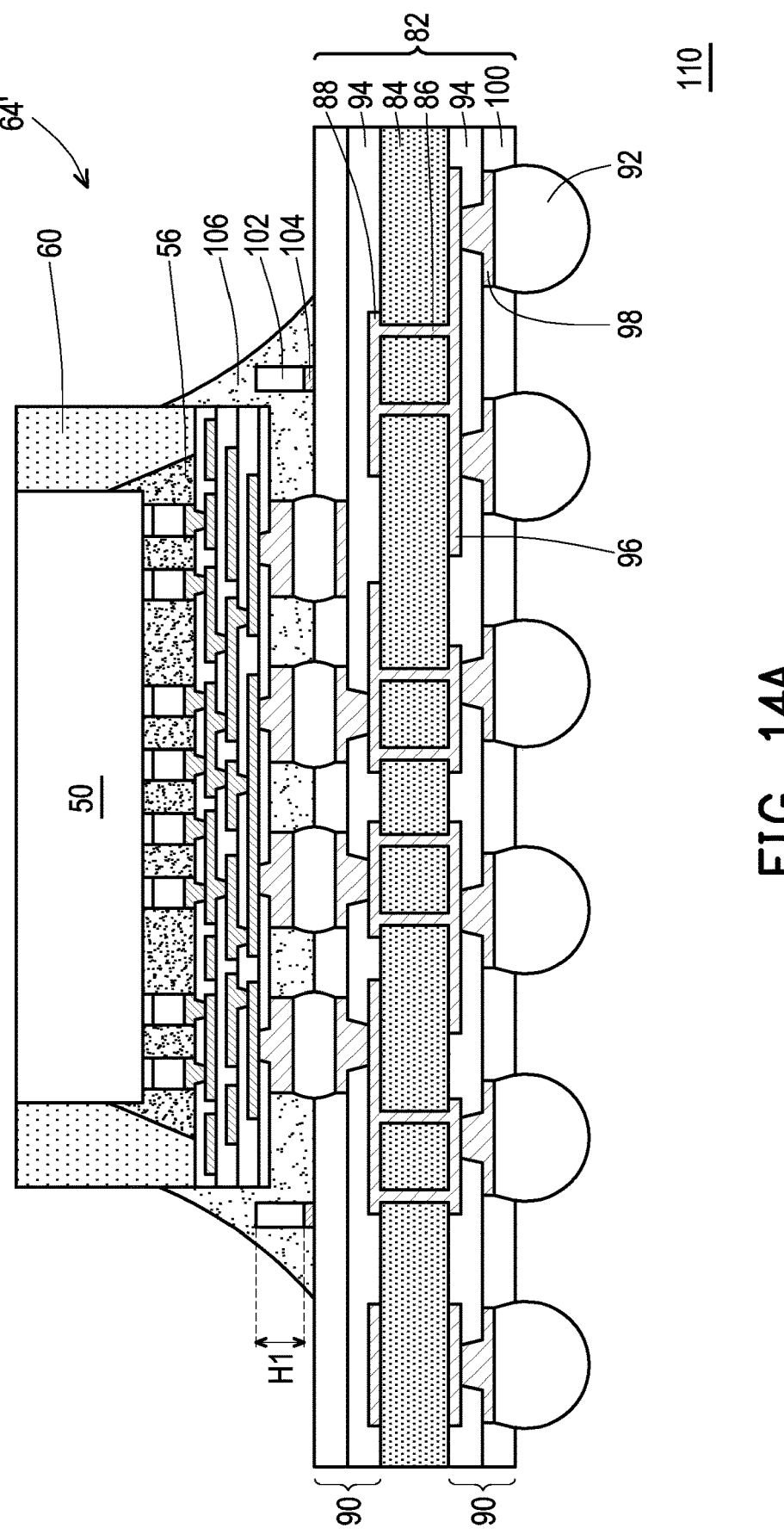

In FIG. 14A, an underfill 106 is formed between the package structure 64' and the substrate 82 to reduce stress and protect the joints between the package structure 64' and the substrate 82, such as the electrical connectors 72. The respective process is illustrated as process 230 in the process flow 200 as shown in FIG. 17. As shown in FIG. 14A, the dam structures 102 may be completely embedded in the underfill 106, wherein top surfaces and sidewalls of the dam structures 102 may be completely covered by the underfill 106. The underfill 106 may extend continuously from the package structure 64' to the substrate 82 over the top surfaces of the dam structures 102.

The underfill 106 may include a base material, such as an epoxy, and filler particles in the epoxy. The underfill 106 may have a coefficient of thermal expansion $\alpha 3$ in a range from about $5 \times 10^{-6 \circ}$ C.$^{-1}$ to about $20 \times 10^{-6 \circ}$ C.$^{-1}$, such as about $12 \times 10^{-6 \circ}$ C.$^{-1}$. In some embodiments, the coefficient of thermal expansion $\alpha 3$ of the underfill 106 may be larger than the coefficient of thermal expansion $\alpha 1$ of package structure 64' and the coefficient of thermal expansion $\alpha 2$ of the dam structures 102. In some embodiments, the coefficient of thermal expansion $\alpha 1$ of package structure 64' may match more closely to the coefficient of thermal expansion $\alpha 2$ of the dam structures 102 than to the coefficient of thermal expansion $\alpha 3$ of the underfill 106. As a result, the dam structures 102 may prevent or reduce the cracking or delamination of the underfill adjacent corners of the package structure 64'.

The underfill 106 may be deposited by a capillary flow process after the dam structures 102 are attached to the substrate 82. For example, the underfill 106 may be dispensed from one side of the package structure 64', and flow into gaps between the package structure 64' and the substrate 82 as well as gaps between the package structure 64' and the dam structures 102 through capillary action. The underfill 106 may be subsequently cured. The structure shown in FIG. 14A may be referred to as a semiconductor package 110. FIG. 14A illustrates the underfill 106 has curved sidewalls as an example, the sidewalls of the underfill 106 may have other shapes.

Figure 14B:
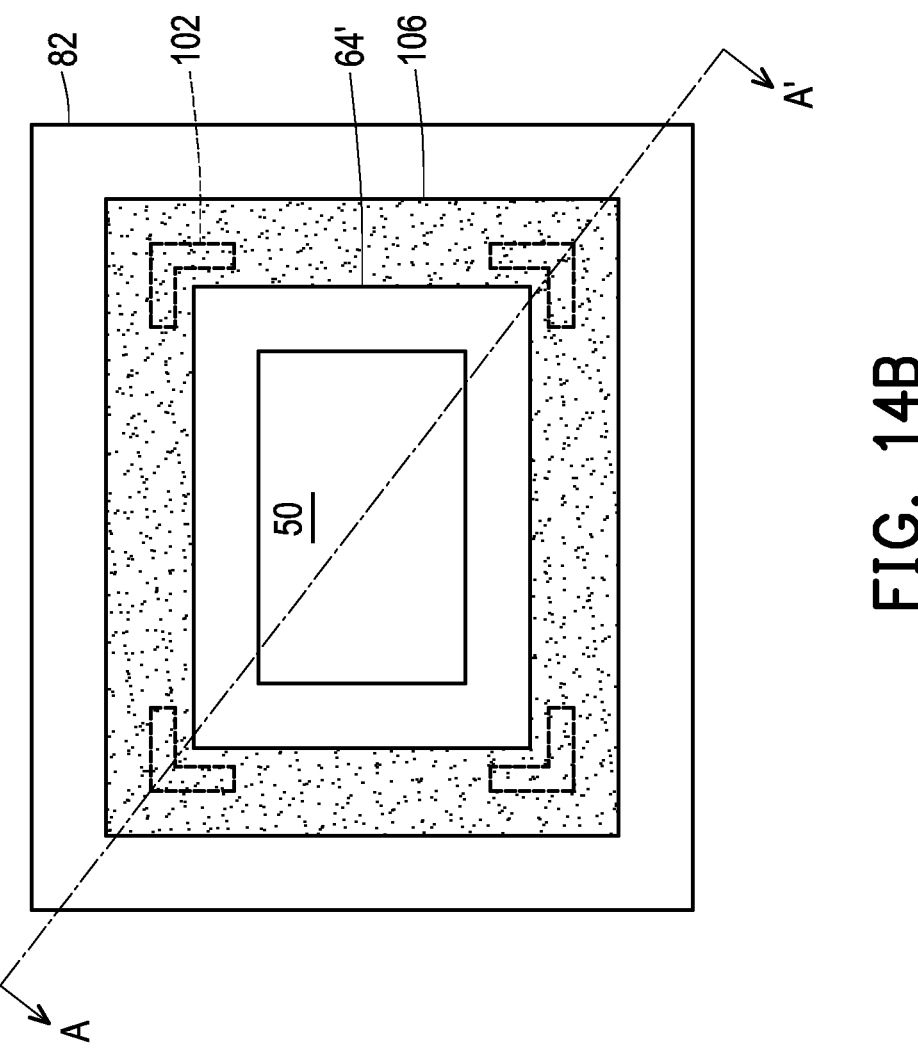

FIG. 14B shows a top view of the semiconductor package 110 shown in FIG. 14A, wherein like reference numerals refer to like features. The cross-sectional view of the semiconductor package 110 shown in FIG. 14A may be obtained from the reference cross-section A-A' in the top view of the semiconductor package 110 shown in FIG. 14B. The dam structures 102 may not be visible in the top view of the semiconductor package 110, but are shown in dotted lines for illustrative purposes. As shown in FIG. 14B, the dam structures 102 may be disposed adjacent corners of the package structure 64'. The dam structures 102 and the package structure 64' may be individually encircled by the underfill 106. Each of the dam structures 102 may have a shape of a bracket.

Figure 14D:
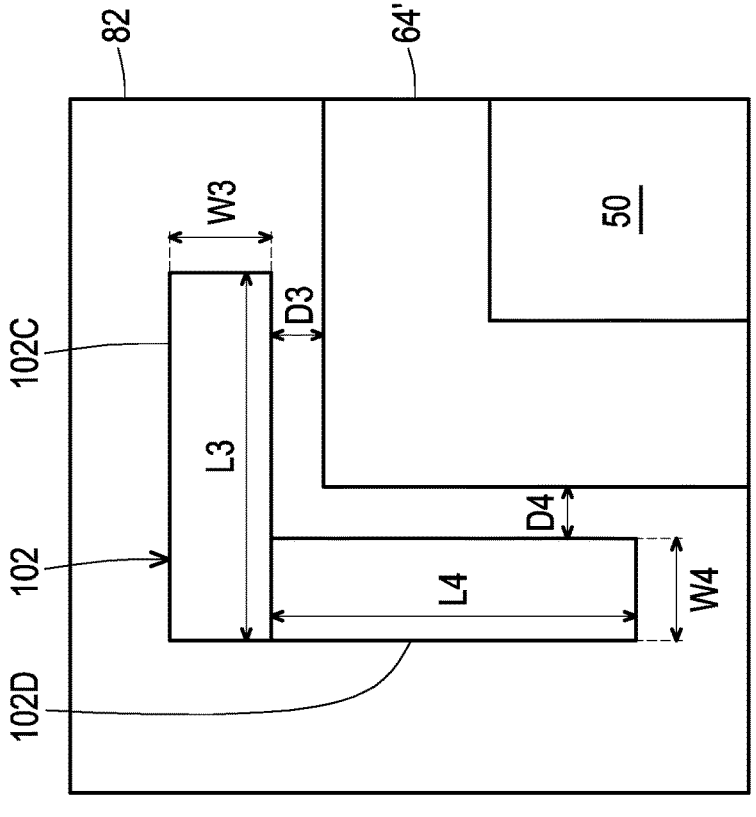
Figure 14C:
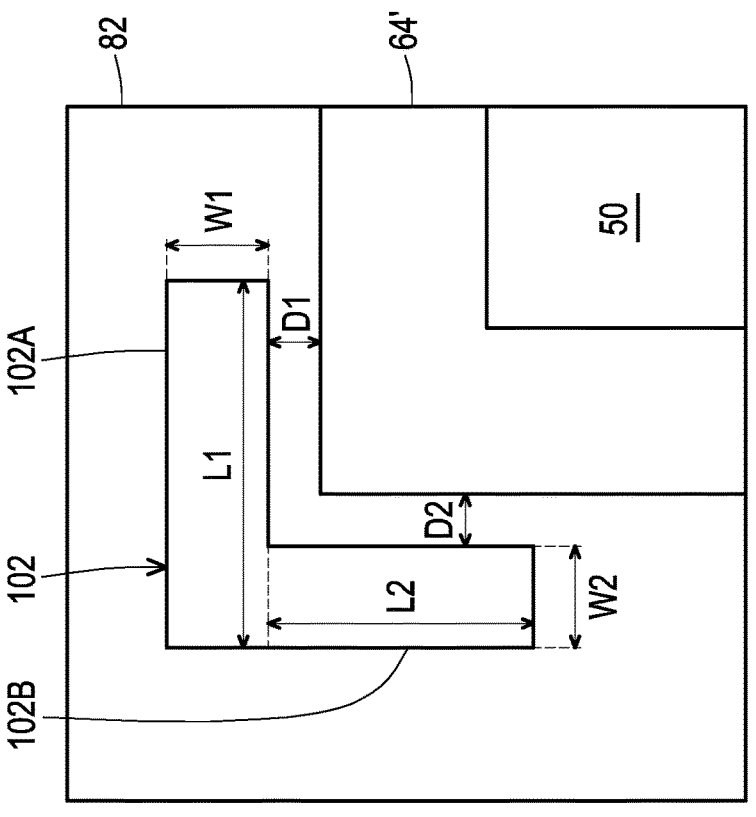

FIG. 14C shows a portion of the top view of the semiconductor package 110 shown in FIG. 14B in accordance with some embodiments, wherein one dam structure 102 disposed adjacent a first corner of the package structure 64' is shown and the underfill 106 is omitted for illustrative purposes. The dam structure 102 may be one piece of material that comprises a first segment 102A extending along a first edge of the package structure 64' and a second segment 102B extending along a second edge of the package structure 64', wherein the first edge may be substantially perpendicular to the second edge, and wherein the first edge and the second edge may intersect at the first corner of the package structure 64'. The first segment 102A may be substantially perpendicular to the second segment 102B. The first segment 102A and the second segment 102B are separated by a dotted line for illustrative purposes.

The first segment 102A may have a length L1 in a range from about 4 mm to about 5 mm, such as about 4.5 mm, and a width W1 in a range from about 1 mm to about 2 mm, such as about 1.5 mm. The second segment 102B may have a length L2 in a range from about 2 mm to about 3 mm, such as about 2.5 mm, and a width W2 in a range from about 1 mm to about 2 mm, such as about 1.5 mm. The first segment 102A may be spaced apart from the first edge of the package structure 64' by a distance D1 smaller than about 1 mm, such as about 0.5 mm, and the second segment 102B may be spaced apart from the second edge of the package structure 64' by a distance D2 smaller than about 1 mm, such as about 0.5 mm. As a result, a layer of the underfill 106 disposed between the first segment 102A and the first edge of the package structure 64' may have a thickness equal to the distance D1, and a layer of the underfill 106 disposed between the second segment 102B and the second edge of the package structure 64' may have a thickness equal to the distance D2. When the thicknesses of the layers of the underfill 106 disposed between the dam structure 102 and the package structure 64' are within the aforementioned ranges of the distance D1 and the distance D2, the cracking or delamination of the underfill 106 adjacent corners of the package structure 64' may be prevented or reduced.

FIG. 14D shows another configuration of the dam structure 102 shown in FIG. 14C in accordance with some embodiments, wherein the dam structure 102 disposed adjacent the first corner of the package structure 64' is shown and the underfill 106 is omitted for illustrative purposes. The dam structure 102 may be two pieces of material, which are a first segment 102C extending along the first edge of the package structure 64' and a second segment 102D extending along the second edge of the package structure 64'. The first segment 102C may be substantially perpendicular to the second segment 102D, and a side of the first segment 102C may overlap a side of the second segment 102D. The first segment 102C may have a length L3 in a range from about 4 mm to about 5 mm, such as about 4.5 mm, and a width W3 in a range from about 1 mm to about 2 mm, such as about 1.5 mm. The second segment 102D may have a length L4 in a range from about 4 mm to about 5 mm, such as about 4.5 mm, and a width W4 in a range from about 1 mm to about 2 mm, such as about 1.5 mm. The first segment 102C may be spaced apart from the first edge of the package structure 64' by a distance D3 smaller than about 1 mm, such as about 0.5 mm, and the second segment 102D may be spaced apart from the second edge of the package structure 64' by a distance D4 smaller than about 1 mm, such as about 0.5 mm. For similar reasons described with respect to FIG. 14C, when the thicknesses of the layers of the underfill 106 disposed between the dam structure 102 and the package structure 64' are within the aforementioned ranges of the distance D3 and the distance D4, the cracking or delamination of the underfill 106 adjacent corners of the package structure 64' may be prevented or reduced.

Figure 14E:
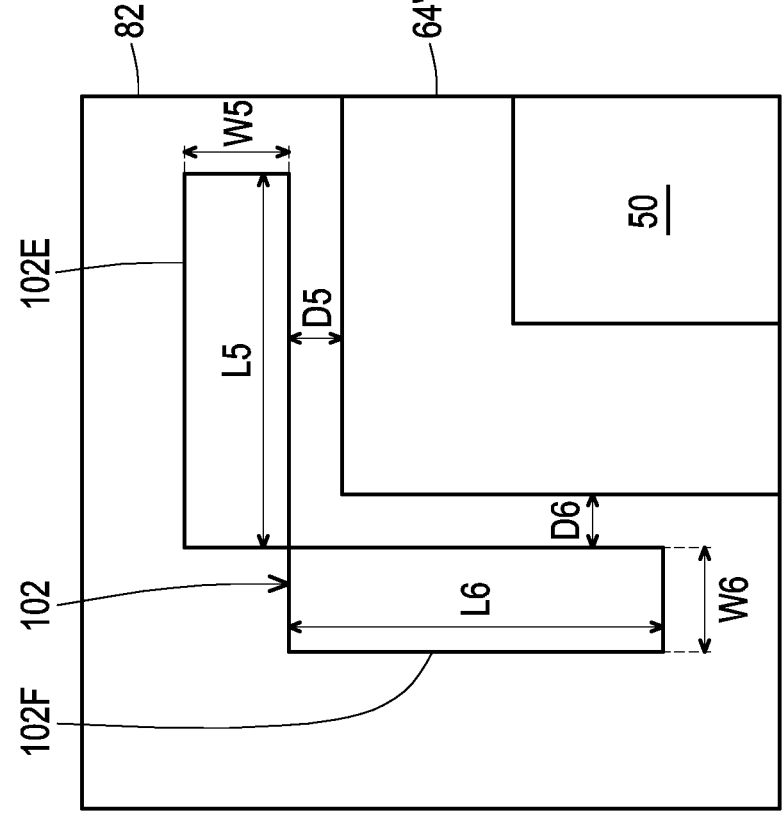

FIG. 14E shows yet another configuration of the dam structure 102 shown in FIG. 14C in accordance with some embodiments, wherein the dam structure 102 disposed adjacent the first corner of the package structure 64' is shown and the underfill 106 is omitted for illustrative purposes. The dam structure 102 may be two pieces of material, which are a first segment 102E extending along the first edge of the package structure 64' and a second segment 102F extending along the second edge of the package structure 64'. The first segment 102E may be substantially perpendicular to the second segment 102F, and a corner of the first segment 102E may overlap a corner of the second segment 102F. The first segment 102E may have a length L5 in a range from about 4 mm to about 5 mm, such as about 4.5 mm, and a width W5 in a range from about 1 mm to about 2 mm, such as about 1.5 mm. The second segment 102F may have a length L6 in a range from about 4 mm to about 5 mm, such as about 4.5 mm, and a width W6 in a range from about 1 mm to about 2 mm, such as about 1.5 mm. The first segment 102E may be spaced apart from the first edge of the package structure 64' by a distance D5 smaller than about 1 mm, such as about 0.5 mm, and the second segment 102F may be spaced apart from the second edge of the package structure 64' by a distance D6 smaller than about 1 mm, such as about 0.5 mm. For similar reasons described with respect to FIG. 14C, when the thicknesses of the layers of the underfill 106 disposed between the dam structure 102 and the package structure 64' are within the aforementioned ranges of the distance D5 and the distance D6, the cracking or delamination of the underfill 106 adjacent corners of the package structure 64' may be prevented or reduced.

Figure 15A:
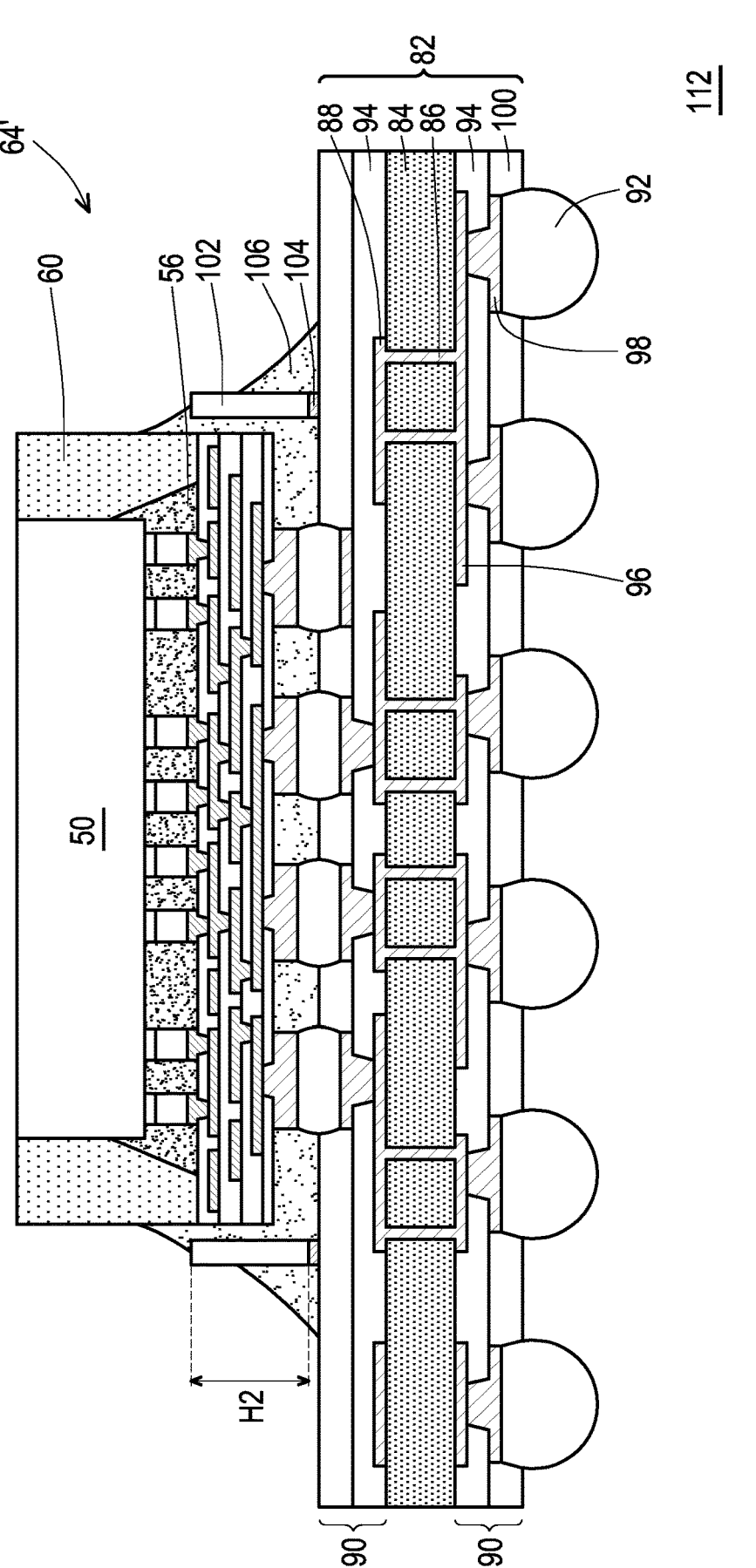

FIG. 15A shows a semiconductor package 112 similar to the semiconductor package 110 shown FIG. 14A in accordance with some embodiments, wherein like reference numerals refer to like features. In FIG. 15A, the dam structures 102 may have a height H2 in a range from about 0.7 mm to about 0.8 mm. As a result, the dam structures 102 may protrude from the underfill 106, wherein inner sidewalls of the dam structures 102 facing the package structure 64' may be completely covered by the underfill 106, while top surfaces and outer sidewalls of the dam structures 102 may be partially covered by the underfill 106. The underfill 106 may extend continuously from the package structure 64' to the top surfaces of the dam structures 102 and from the outer sidewalls of the dam structures 102 to the substrate 82.

Figure 15B:
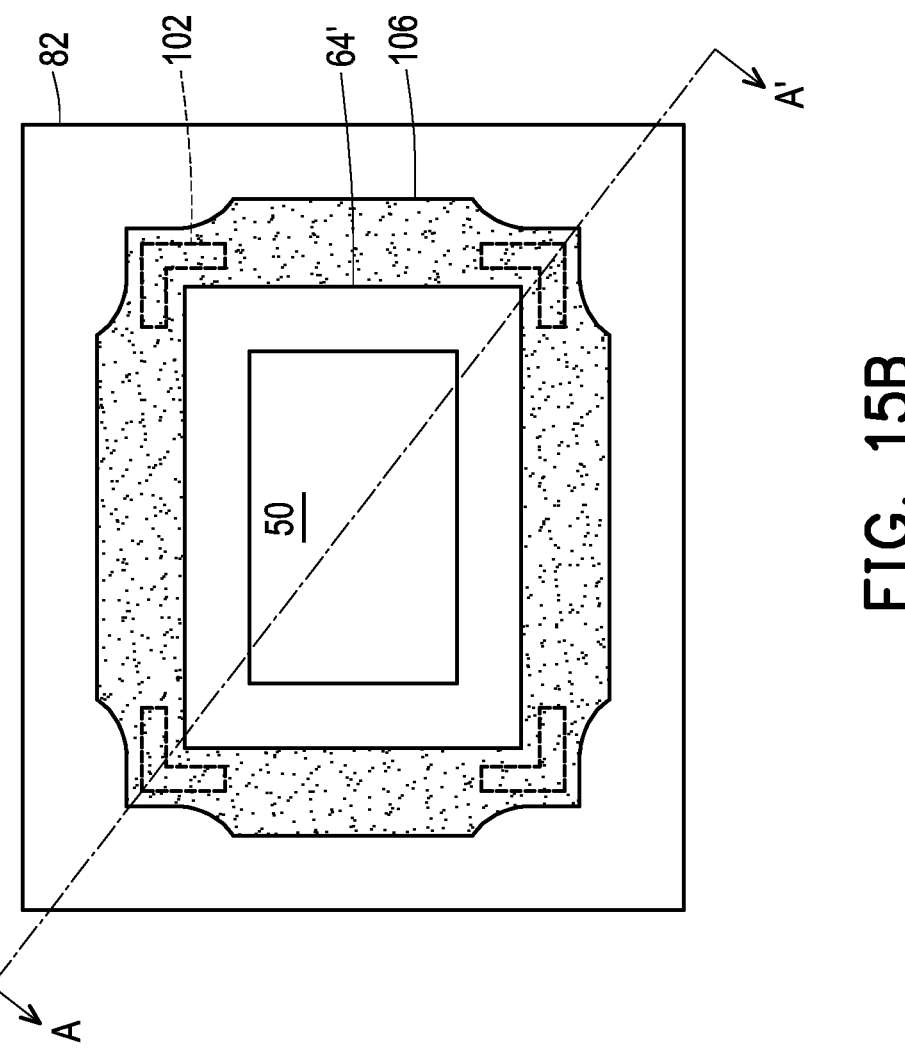

FIG. 15B shows a top view of the semiconductor package 112 shown in FIG. 15A, wherein like reference numerals refer to like features. The cross-sectional view of the semiconductor package 112 shown in FIG. 15A may be obtained from the reference cross-section A-A' in the top view of the semiconductor package 112 shown in FIG. 15B. The dam structures 102 may not be completely visible in the top view of the semiconductor package 112, but are shown in dotted lines for illustrative purposes. The composition, locations relative to the package structure 64', as well as shapes and sizes in the top view of the dam structures 102 of the semiconductor package 112 may be substantially the same as the composition, locations relative to the package structure 64', as well as shapes and sizes in the top view of the dam structures 102 of the semiconductor package 110, respectively, described with respect to FIGS. 14B through 14E. As a result, the dam structures 102 of the semiconductor package 112 may have substantially the same advantages as the dam structures 102 of the semiconductor package 110 in preventing or reducing the cracking or delamination of the underfill 106 adjacent corners of the package structure 64'. As shown in FIG. 15B, the dam structures 102 may be encircled by the underfill 106, wherein a layer of the underfill 106 on the outer sidewall of a segment of each dam structure 102 tapers as the layer of the underfill 106 extends towards the other segment of each dam structure 102.

Figure 16A:
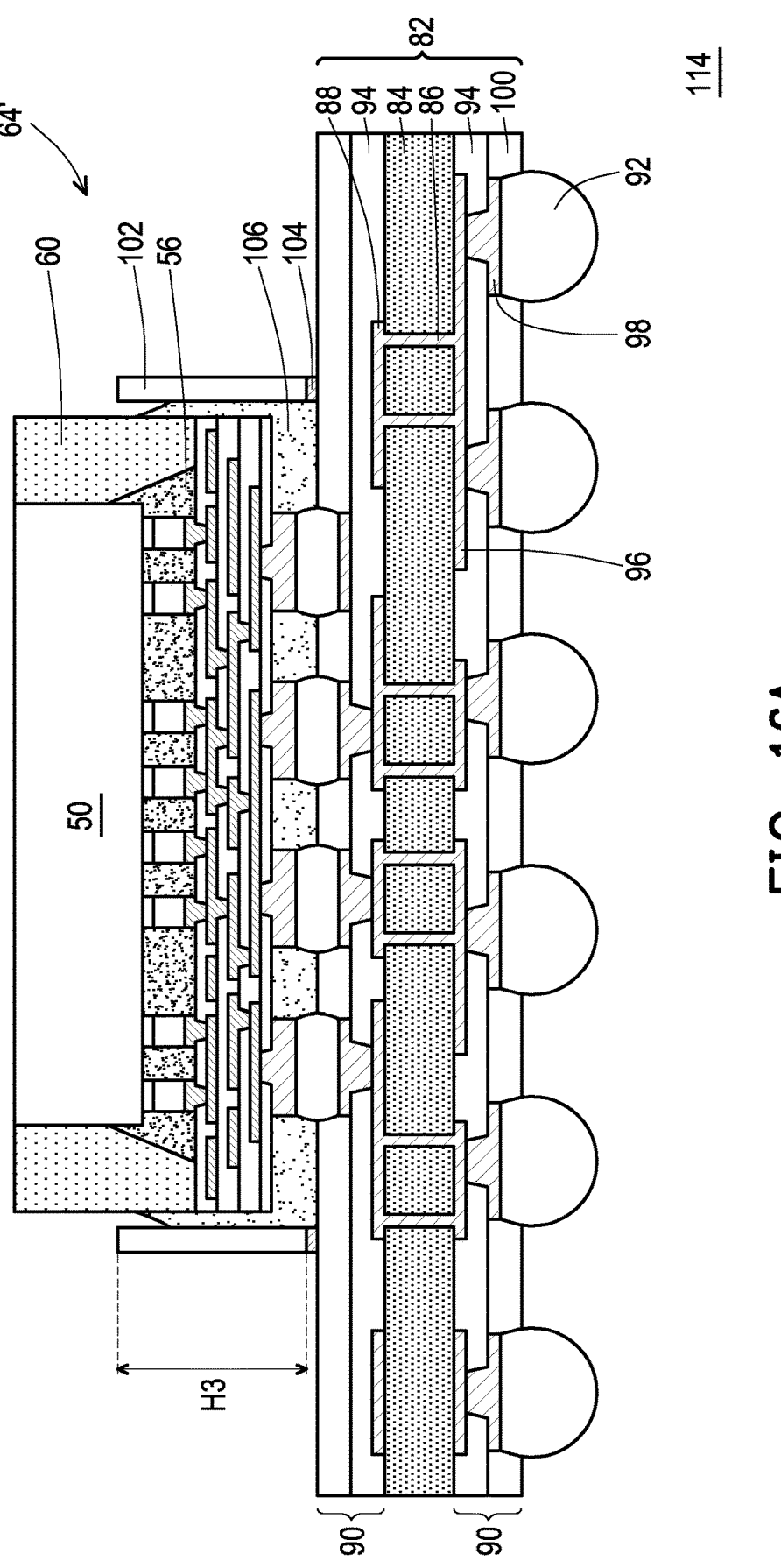

FIG. 16A shows a semiconductor package 114 similar to the semiconductor package 110 shown FIG. 14A in accordance with some embodiments, wherein like reference numerals refer to like features. In FIG. 16A, the dam structures 102 may have a height H3 in a range from about 0.8 mm to about 1 mm. As a result, the dam structures 102 may protrude from the underfill 106, wherein inner sidewalls of the dam structures 102 facing the package structure 64' may be partially covered by the underfill 106, while top surfaces and outer sidewalls of the dam structures 102 may be free of the underfill 106. The underfill 106 may extend continuously from the package structure 64' to the inner sidewalls of the dam structures 102.

Figure 16B:
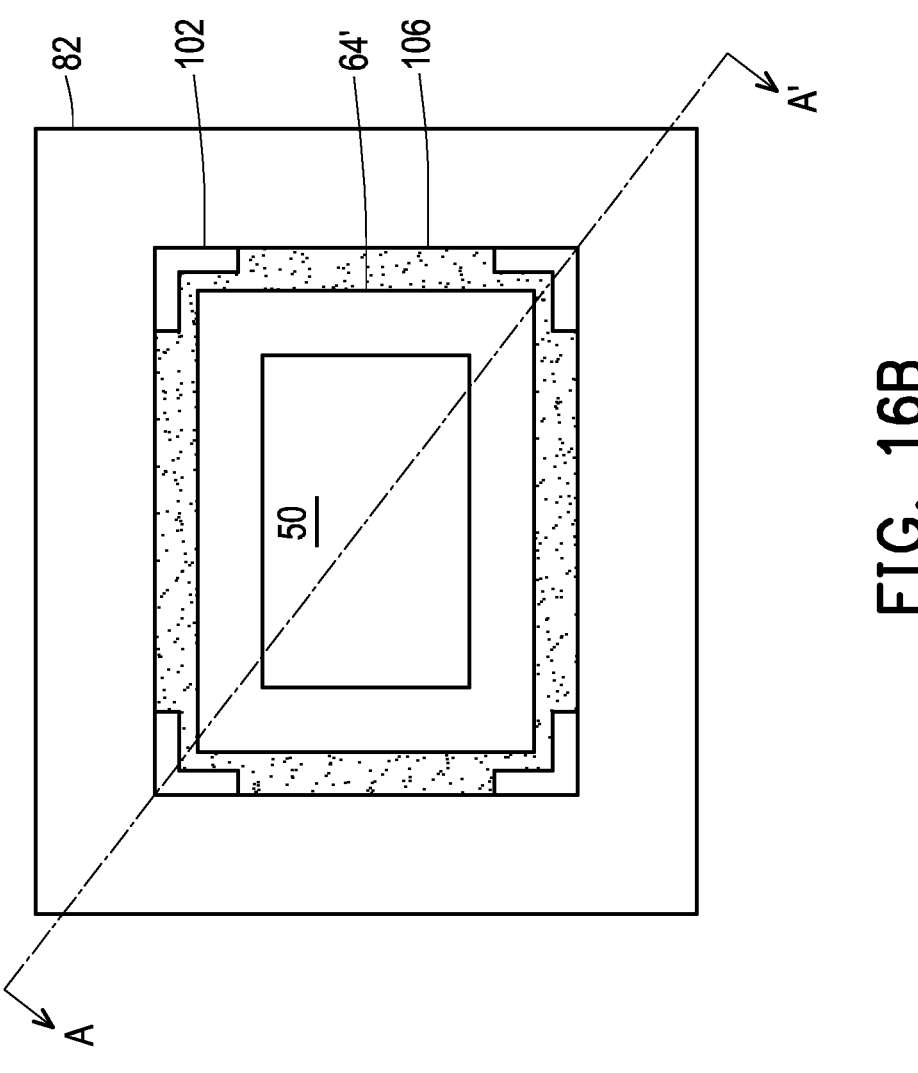

FIG. 16B shows a top view of the semiconductor package 114 shown in FIG. 16A, wherein like reference numerals refer to like features. The cross-sectional view of the semiconductor package 114 shown in FIG. 16A may be obtained from the reference cross-section A-A' in the top view of the semiconductor package 114 shown in FIG. 16B. The composition, locations relative to the package structure 64', as well as shapes and sizes in the top view of the dam structures 102 of the semiconductor package 114 may be substantially the same as the composition, locations relative to the package structure 64', as well as shapes and sizes in the top view of the dam structures 102 of the semiconductor package 110, respectively, described with respect to FIGS. 14B through 14E. As a result, the dam structures 102 of the semiconductor package 114 may have substantially the same advantages as the dam structures 102 of the semiconductor package 110 in preventing or reducing the cracking or delamination of the underfill 106 adjacent corners of the package structure 64'. As shown in FIG. 15B, inner sidewalls of the dam structures

102 facing the package structure 64' may be in direct contact with the underfill 106 and the outer sidewalls of the dam structures 102 opposite the inner sidewalls are free of contact with the underfill 106.

The embodiments of the present disclosure have some advantageous features. By utilizing the dam structures 102 of select materials and at select locations on the substrate 82 and in the underfill 106, cracking or delamination of the underfill 106 adjacent corners of the package structure 64' may be prevented or reduced, which leads to better long-term reliability of the semiconductor package 110, the semiconductor package 112, and the semiconductor package 114.

In an embodiment, a semiconductor package includes a package component, the package component further including an interposer having a plurality of insulating layers and a plurality of redistribution lines in the plurality of insulating layers; a semiconductor die bonded to a first side of the interposer; and an encapsulant on the first side of the interposer, wherein the encapsulant encircles the semiconductor die in a top view, and wherein the package component has a first coefficient of thermal expansion; a substrate bonded to the package component on a second side of the interposer; an underfill between the package component and the substrate, wherein the underfill encircles the package component in the top view, and wherein the underfill has a second coefficient of thermal expansion; and one or more of dam structures on the substrate, wherein the one or more dam structures are disposed adjacent respective corners of the package component in the top view, wherein the one or more dam structures are in direct contact with the underfill, and wherein the one or more of dam structures have a third coefficient of thermal expansion smaller than the second coefficient of thermal expansion. In an embodiment, the one or more dam structures are embedded in the underfill. In an embodiment, the one or more dam structures protrude from the underfill. In an embodiment, each of the one or more dam structures has a first segment extending along a first edge of the package component and a second segment extending along a second edge of the package component, wherein the first edge is perpendicular to the second edge. In an embodiment, the first segment is spaced apart from the first edge by a first distance and the second segment is spaced apart from the second edge by a second distance, and wherein the first distance and the second distance are smaller than 1 mm. In an embodiment, the first coefficient of thermal expansion matches more closely to the third coefficient of thermal expansion than to the second coefficient of thermal expansion. In an embodiment, the one or more dam structures include silicon and wherein the one or more dam structures are attached to the substrate by die attach films.

In an embodiment, a semiconductor package includes an interposer having a first edge and a second edge, wherein the first edge and the second edge intersect at a first corner of the interposer, the interposer further including a plurality of insulating layers; and a plurality of conductive lines in the plurality of insulating layers; a package component bonded to a first side of the interposer, wherein the package component includes a semiconductor die; a substrate bonded to a second side of the interposer; an underfill between the interposer and the substrate, wherein the underfill encircles the interposer in a top view; and a divider structure disposed on the substrate and adjacent the first corner, wherein the divider structure includes a first segment extending along the first edge, wherein a first underfill layer is disposed between the first segment and the first edge, and wherein a thickness of the first underfill layer is smaller than 1 mm. In an embodiment, the divider structure has a first coefficient of thermal expansion, and wherein the underfill has a second coefficient of thermal expansion larger than the first coefficient of thermal expansion. In an embodiment, the divider structure includes a second segment extending along the second edge, and wherein a top surface of the divider structure has a shape of a bracket in the top view. In an embodiment, a second underfill layer is disposed between the second segment and the second edge, and wherein a thickness of the second underfill layer is smaller than 1 mm. In an embodiment, the first segment includes a first sidewall in direct contact with the first underfill layer, wherein the first segment includes a second sidewall opposite the first sidewall and in direct contact with a second underfill layer, and wherein the thickness of the second underfill layer tapers as the second underfill layer extends towards the second segment in the top view. In an embodiment, a top surface of the divider structure is partially covered by the underfill. In an embodiment, a top surface of the divider structure is free of the underfill.

In an embodiment, a method of manufacturing a semiconductor package includes forming an interposer, wherein the interposer includes a plurality of insulating layers and a plurality of redistribution lines in the plurality of insulating layers, wherein the interposer include a first edge and a second edge, and wherein the first edge and the second edge meet at a first corner of the interposer; bonding a package component to a first side of the interposer, wherein the package component includes a semiconductor die; forming an encapsulant on the interposer and the package component; bonding a substrate to a second side of the interposer; attaching a wall structure on the substrate, the wall structure being adjacent the first corner in a top view, wherein the wall structure includes a first segment extending along the first edge and a second segment extending along the second edge; and forming an underfill between the interposer and the substrate, wherein the wall structure is in direct contact with the underfill, and wherein a coefficient of thermal expansion of the wall structure is smaller than the coefficient of thermal expansion of the underfill. In an embodiment, the underfill encircles the wall structure in the top view. In an embodiment, the first segment includes a first sidewall in direct contact with the underfill and a second sidewall opposite the first sidewall, wherein the second sidewall is free of contact with the underfill. In an embodiment, the second segment includes a third sidewall in direct contact with the underfill and a fourth sidewall opposite the third sidewall, wherein the fourth sidewall is free of contact with the underfill. In an embodiment, the second segment includes a first sidewall in direct contact with the underfill, and wherein a distance between the first sidewall and the second edge is smaller than 1 mm. In an embodiment, the second segment includes a first sidewall facing the second edge and a second sidewall parallel with the first sidewall, wherein the first sidewall is closer to the second edge than the second sidewall is to the second edge, wherein a first portion of the underfill extends along the second sidewall, and wherein a thickness of first portion of the underfill decreases as first portion of the underfill extends towards the first segment in the top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a package component, the package component further comprising:
      an interposer having a plurality of insulating layers and a plurality of redistribution lines in the plurality of insulating layers;
      a semiconductor die bonded to a first side of the interposer; and
      an encapsulant on the first side of the interposer, wherein the encapsulant encircles the semiconductor die in a top view, and wherein the package component has a first coefficient of thermal expansion;
   a substrate bonded to the package component on a second side of the interposer;
   an underfill between the package component and the substrate, wherein the underfill encircles the package component in the top view, and wherein the underfill has a second coefficient of thermal expansion; and
   one or more dam structures on the substrate, wherein the one or more dam structures are disposed adjacent respective corners of the package component in the top view, wherein the one or more dam structures are in direct contact with the underfill, and wherein the one or more dam structures have a third coefficient of thermal expansion smaller than the second coefficient of thermal expansion.

2. The semiconductor package of claim 1, wherein the one or more dam structures are embedded in the underfill.

3. The semiconductor package of claim 1, wherein the one or more dam structures protrude from the underfill.

4. The semiconductor package of claim 1, wherein each of the one or more dam structures has a first segment extending along a first edge of the package component and a second segment extending along a second edge of the package component, wherein the first edge is perpendicular to the second edge.

5. The semiconductor package of claim 4, wherein the first segment is spaced apart from the first edge by a first distance and the second segment is spaced apart from the second edge by a second distance, and wherein the first distance and the second distance are smaller than 1 mm.

6. The semiconductor package of claim 1, wherein the first coefficient of thermal expansion matches more closely to the third coefficient of thermal expansion than to the second coefficient of thermal expansion.

7. The semiconductor package of claim 1, wherein the one or more dam structures comprise silicon and wherein the one or more dam structures are attached to the substrate by die attach films.

8. A semiconductor package comprising:
   an interposer having a first edge and a second edge, wherein the first edge and the second edge intersect at a first corner of the interposer, the interposer further comprising:
      a plurality of insulating layers; and
      a plurality of conductive lines in the plurality of insulating layers;
   a package component bonded to a first side of the interposer, wherein the package component comprises a semiconductor die;

a substrate bonded to a second side of the interposer;

an underfill between the interposer and the substrate, wherein the underfill encircles the interposer in a top view; and a divider structure disposed on the substrate and adjacent the first corner, wherein the underfill encircles the divider structure in the top view, wherein the divider structure comprises a first segment extending along the first edge, wherein a first portion of the underfill is disposed between the first segment and the first edge, and wherein a thickness of the first portion of the underfill is smaller than 1 mm.

9. The semiconductor package of claim 8, wherein the divider structure has a first coefficient of thermal expansion, and wherein the underfill has a second coefficient of thermal expansion larger than the first coefficient of thermal expansion.

10. The semiconductor package of claim 8, wherein the divider structure comprises a second segment extending along the second edge, and wherein a top surface of the divider structure has a shape of a bracket in the top view.

11. The semiconductor package of claim 10, wherein a second portion of the underfill is disposed between the second segment and the second edge, and wherein a thickness of the second portion of the underfill is smaller than 1 mm.

12. The semiconductor package of claim 10, wherein the first segment comprises a first sidewall in direct contact with the first portion of the underfill, wherein the first segment comprises a second sidewall opposite the first sidewall and in direct contact with a second portion of the underfill, and wherein a thickness of the second portion of the underfill tapers as the second portion of the underfill extends towards the second segment in the top view.

13. The semiconductor package of claim 8, wherein a top surface of the divider structure is partially covered by the underfill.

14. The semiconductor package of claim 8, wherein a top surface of the divider structure is free of the underfill.

15. A semiconductor package comprising:

a package component, the package component further comprising:

an interposer, wherein the interposer comprises a first edge and a second edge, and wherein the first edge and the second edge meet at a first corner of the interposer; and a semiconductor die bonded to a first side of the interposer;

a substrate bonded to the package component on a second side of the interposer;

an underfill between the package component and the substrate, wherein the underfill encircles the package component in a top view, and wherein the underfill has a first coefficient of thermal expansion; and a dam structure on the substrate adjacent the first corner in the top view, wherein the dam structure is in direct contact with the underfill, wherein the dam structure comprises a first segment extending along the first edge and a second segment extending along the second edge, and wherein the dam structure has a second coefficient of thermal expansion smaller than the first coefficient of thermal expansion.

16. The semiconductor package of claim 15, wherein the underfill encircles the dam structure in the top view.

17. The semiconductor package of claim 15, wherein the first segment comprises a first sidewall and a second sidewall opposite the first sidewall, wherein the first sidewall is in direct contact with the underfill, and wherein the second sidewall is free of contact with the underfill.

18. The semiconductor package of claim 17, wherein the second segment comprises a third sidewall and a fourth sidewall opposite the third sidewall, wherein the third sidewall is in direct contact with the underfill, and wherein the fourth sidewall is free of contact with the underfill.

19. The semiconductor package of claim 15, wherein the second segment comprises a first sidewall in direct contact with the underfill, and wherein a distance between the first sidewall and the second edge is smaller than 1 mm.

20. The semiconductor package of claim 15, wherein the second segment comprises a first sidewall facing the second edge and a second sidewall parallel with the first sidewall, wherein the first sidewall is closer to the second edge than the second sidewall is to the second edge, wherein a first portion of the underfill extends along the second sidewall, and wherein a thickness of the first portion of the underfill decreases as the first portion of the underfill extends towards the first segment in the top view.

* * * * *